United States Patent
Suzuki

(10) Patent No.: US 7,616,042 B2
(45) Date of Patent: Nov. 10, 2009

(54) CLOCK GENERATOR CIRCUIT, SIGNAL MULTIPLEXING CIRCUIT, OPTICAL TRANSMITTER, AND CLOCK GENERATION METHOD

(75) Inventor: Toshihide Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/117,382

(22) Filed: Apr. 29, 2005

(65) Prior Publication Data
US 2006/0132213 A1    Jun. 22, 2006

(30) Foreign Application Priority Data
Dec. 16, 2004   (JP)   ............... 2004-364389

(51) Int. Cl.
*G06F 1/04*    (2006.01)

(52) U.S. Cl. .............. 327/291; 327/293; 327/255; 327/256

(58) Field of Classification Search ............. 327/291
See application file for complete search history.

(56) References Cited

U.S. PATENT DOCUMENTS

| | | | | |
|---|---|---|---|---|
| 5,150,364 | A * | 9/1992 | Negus ..................... | 370/542 |
| 5,341,031 | A * | 8/1994 | Kinoshita et al. ......... | 327/259 |
| 6,441,656 | B1 * | 8/2002 | Yee et al. ................ | 327/115 |
| 6,501,315 | B1 * | 12/2002 | Nguyen ................... | 327/217 |
| 2002/0070783 | A1 * | 6/2002 | Saeki .................... | 327/235 |
| 2003/0080793 | A1 * | 5/2003 | Pilling .................. | 327/202 |
| 2004/0090999 | A1 * | 5/2004 | Suzuki ................... | 370/537 |
| 2004/0213580 | A1 * | 10/2004 | Masuda et al. ........... | 398/183 |

FOREIGN PATENT DOCUMENTS

| JP | 5-37315 A | 2/1993 |
|---|---|---|
| JP | 2004-147075 A | 5/2004 |

OTHER PUBLICATIONS

L. Yang, et al.: "A Non-Feedback Multiphase Clock Generator"; ISCAS 2002 IEEE International; Symposium, vol. 4, pp. IV-389-IV-392.

* cited by examiner

*Primary Examiner*—Lincoln Donovan
*Assistant Examiner*—Ryan C Jager
(74) *Attorney, Agent, or Firm*—Arent Fox LLP

(57) ABSTRACT

For the purpose of achieving multiplexing of data signals for the channels of more than four in number in the generating of a frequency-divided clock signal using toggle flip-flop circuits (TFF), while avoiding any possible phase shift relationship between generated frequency-divided clock signals attributed to the indefinite initial state posing the inherent problem of the TFF, there is provided a clock generator circuit comprising a plurality of toggle flip-flop circuits connected in series, capable of outputting a pair of frequency-divided clock signals with different phases; and a delay circuit connected to the toggle flip-flop circuit, capable of outputting a clock signal with a phase shifted with respect to the phases of the pair of frequency-divided clock signal phases by delaying either one or both of the pair of frequency-divided clock signals being outputted from the toggle flip-flop circuits.

9 Claims, 7 Drawing Sheets

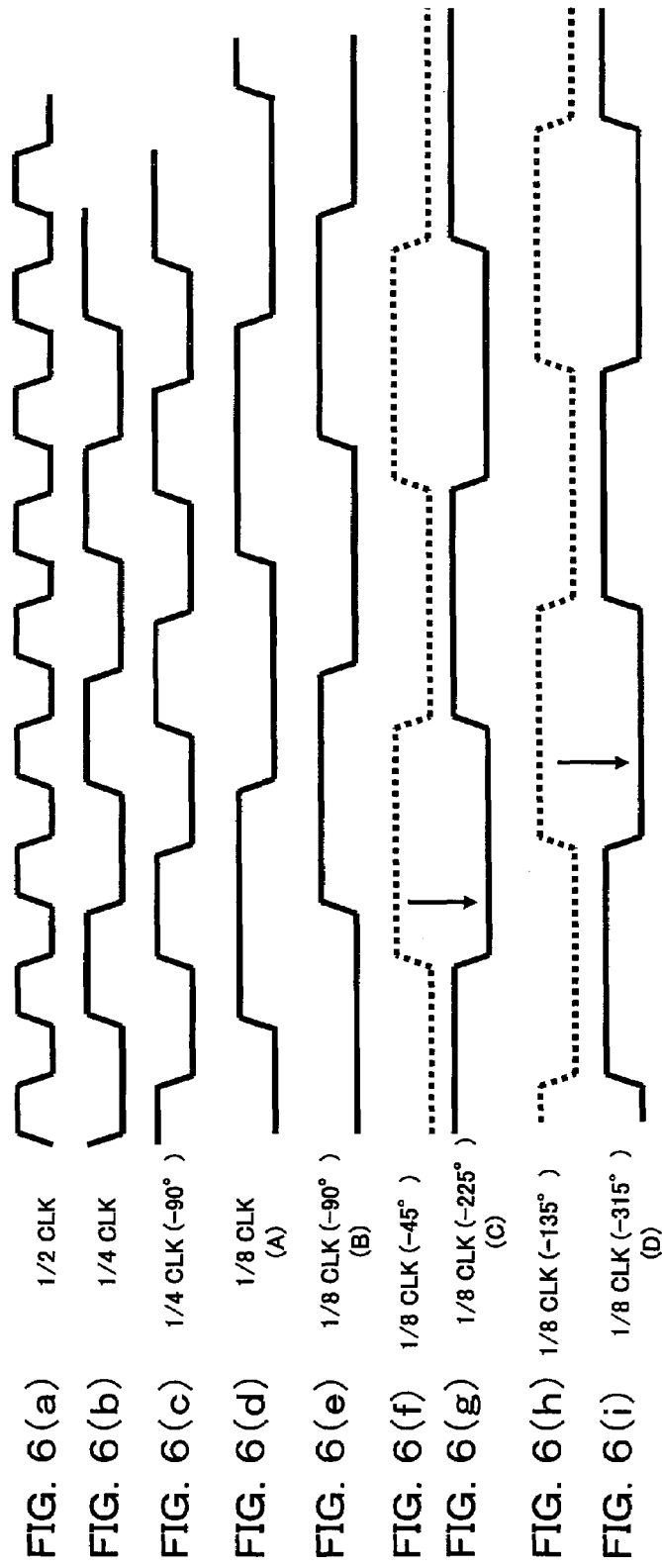

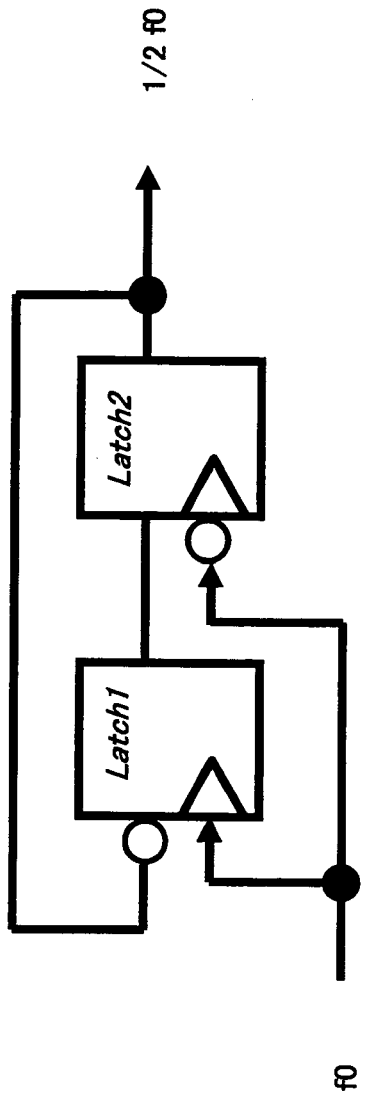
FIG. 7(A)
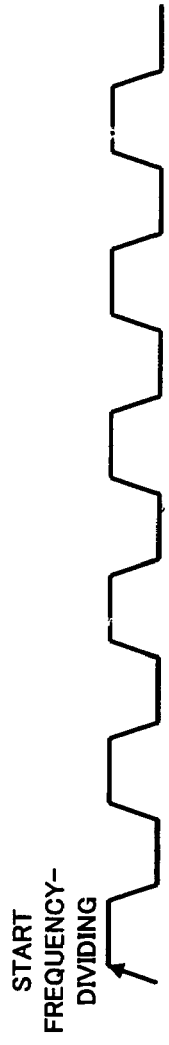
FIG. 7(B) f0
FIG. 7(C) 1/2 f0
FIG. 7(D) 1/2 f0 (−180°)

CLOCK GENERATOR CIRCUIT, SIGNAL MULTIPLEXING CIRCUIT, OPTICAL TRANSMITTER, AND CLOCK GENERATION METHOD

CROSS REFERENCE TO RELATED APPLICATIONS

This application is based on and hereby claims priority to Japanese Patent Application No. 2004-364389 filed on 16 Dec. 2004 in Japan, the contents of which are hereby incorporated by reference

BACKGROUND OF THE INVENTION (1) Field of the Invention

The present invention relates to a clock generator circuit for generating a plurality of clock signals with different phases, a signal multiplexing circuit (multiplexer circuit) including the clock generator circuit, and an optical transmitter including same, preferably in an optical communication system, and a clock generation method.

(2) Description of Related Art

In recent years, in the field of an optical communication system, for example, an optical transmitter etc. thereof, there is a need for a multiplexer circuit capable of operating at high speed at high frequency with sufficient reliability.

In the conventional multiplexer circuit, for example, when there are to be multiplexed 4-channel input data signals based on clock signals, two multiplexed data signals are generated first by multiplexing the input data signals on a 2-channel basis or per two channels. Thereafter, these multiplexed data signals are multiplexed further, whereby there is generated a multiplexed data signal in which 4-channel data signals are multiplexed.

In this case, since frequency-divided clock signals with the same phase are to be used in multiplexing on a 2-channel basis or per two channels, there are produced the same phase relationship between two multiplexed data signals generated by multiplexing on a 2-channel basis. In further multiplexing such multiplexed data signals with the same phase, when the multiplexed data signals with the same phase are selected based on clock signals with aligned edge timing (in the event of lack in phase margin between the two multiplexed data signals and the clock signals), a slight displacement in the clock signal timing (phase) will result in failure to multiplex the signals. Therefore, in order to obtain optimal phase timing, a latch circuit (for example, a D latch) is provided so as to produce a phase difference, by providing a phase shift of $\pi$ of the two multiplexed data signals intended to be selected relative to each other, thereby achieving a timing margin (phase margin). With this provision, highly reliable signal multiplexing processing can be carried out even when high-speed operation at high frequency is required.

However, the above-configured multiplexer circuit needs the latch circuit (for example, D latch) and a circuit for supplying a clock thereto, and the like, which results in problematically an increase in circuit size and the power consumption, as well as preventing high-speed operation.

Accordingly, the inventor of the present invention has proposed a multiplexer circuit for multiplexing data signals, by use of a toggle flip-flop (TFF) which outputs, as clock signal, two frequency-divided clock signals with a phase difference of $\pi/2$ relative to each other, so as to prevent the increased in circuit size while achieving optimal phase timing (data timing), and to reduce the power consumption. (For example, refer to the Japanese Patent Laid-Open (Kokai) 2004-147075.)

Here, as an example of $\pi/2$ phase-difference signal generator circuit having a toggle flip-flop (TFF), there is the one disclosed in Japanese Patent Laid-Open (Kokai) Hei-5-037315.

SUMMARY OF THE INVENTION

Now, in the configuration described in the above-mentioned Japanese Patent Laid-Open (Kokai) 2004-147075, there is a possibility to realize a circuit for multiplexing 4-channel data signals.

However, in the multiplexing of data signals for the channels more than four in number, it has turned out that it makes difficulties to realize this using a configuration similar to the circuit for multiplexing 4-channel data signals described in the above Japanese Patent Laid-Open (Kokai) 2004-147075, as will be explained below.

Hereafter, an exemplary configuration having been considered in the way of the process of devising the present invention will be described.

Here, referring to FIG. 4, an exemplary signal multiplexing circuit (16:1 MUX circuit) for multiplexing 16-channel data signals, using multiphase frequency-divided clock signals will be illustrated. In FIG. 4, symbols 101-104 are selector circuits (SEL).

As shown in FIG. 4, in the event of configuring the 16:1 MUX circuit, it may be conceived that the circuits described in the above Japanese Patent Laid-Open (Kokai) 2004-147075 (for example, refer to FIG. 4 in the Japanese Patent Laid-Open (Kokai) 2004-147075) are to be disposed in parallel, and connected by 2:1 selector circuits. In this case, as frequency-divided clock signal, similar to that described in the above Japanese Patent Laid-Open (Kokai) 2004-147075, a ½ frequency-divided clock signal with a single phase and a ¼ frequency-divided clock signal with two phases are required. Further, in addition to the above, at the stage (the block) of multiplexing 16-channel data signals on a 2-channel basis, ¹⁄₁₆ frequency-divided clock signals (¹⁄₁₆ CLK) with eight (8) phases are required, and at the stage (the block) of multiplexing eight (8) multiplexed data signals two by two, ⅛ frequency-divided clock signals (⅛ CLK) with four phases are required as well.

In the event of the clock generator circuit (multiphase clock generator circuit) for generating these multiphase frequency-divided clock signals being configured using toggle flip-flops (TFF) only, as in a similar way to that described in the above the Japanese Patent Laid-Open (Kokai) 2004-147075, for example, the circuit configuration as shown in FIG. 5 would be obtained. Here, in FIG. 5, TFF1-TFF7 are toggle flip-flops, each having two latch circuits.

Since, in the event of generating a frequency-divided clock signal in the clock generator circuit having a circuit configuration as shown in FIG. 5, the TFF2 and the TFF3 independently performs frequency division operation, a phase inversion might arise in either one of the frequency-divided clock signals: a ⅛ frequency-divided clock signal shown by the symbol A and a ⅛ frequency-divided clock signal (−90°) shown by the symbol B, which are frequency divided in the TFF2 and outputted therefrom; a ⅛ frequency-divided clock signal (−45°) shown by the symbol C and a ⅛ frequency-divided clock signal (−135°) shown by the symbol D, which are frequency divided in the TFF3 and outputted therefrom, depending on the initial state of each TFF.

For example, as shown in the timing charts in FIG. 6(a)-FIG. 6(i), in some cases the phase of the ⅛ frequency-divided clock signal shown by the symbol (A) and the phase of the ⅛ frequency-divided clock signal (−90°) shown by the symbol (B), which are frequency divided in the TFF2 and outputted therefrom, are not inverted, while only the phase of the ⅛ frequency-divided clock signal (−45°) shown by the symbol (C) and the phase of the ⅛ frequency-divided clock signal (−135°) shown by the symbol (D), which are frequency divided in the TFF3 and outputted therefrom, are inverted. Here, in FIG. 6(a)-FIG. 6(i), the symbols (A)-(D) correspond to the symbols A-D shown in FIG. 5.

Such being the case, in the event of the phase of only one of the frequency-divided clock signals being inverted, in the portion of the symbol C in FIG. 5, undesirably the phase is to be shifted by −225° as shown in FIG. 6(a)-FIG. 6(i) by a solid line with the symbol (C), in spite of a phase shift of −45° to be desired as shown by a dotted line in FIG. 6(a)-FIG. 6(i). Also, in the portion of the symbol D in FIG. 5, the phase is to be shifted by −315° as shown in FIG. 6(a)-FIG. 6(i) by a solid line with the symbol (D), in spite of the phase shift of −135° to be desired as shown by a dotted line in FIG. 6(a)-FIG. 6(i).

The arising of the phase inversion in either one of the frequency-divided clock signals only, which results in a phase shift, is attributed to the fact that the phase of the frequency-divided clock signal being outputted from the TFF is indefinite [i.e. the TFF initial state (either low or high) is indefinite], which is the inherent problem of the TFF. In other words, it depends on the initial logic state (initial state) of the TFF (inside the latch circuit) at the time of starting the frequency division operation (the logic is indefinite), whether the logic of the frequency-divided clock signal being outputted from the TFF becomes low (Lo) or high (Hi) at the time of starting the frequency division operation. However, this TFF initial state is determined by dispersion in circuit, temperature, noise, power supply condition, etc., and it is uncontrollable.

For example, as shown in FIG. 7(A)-FIG. 7(D), in the TFF being constituted of two latch circuits connected in series, when the initial state is low, the phase is shifted by 180° with respect to that in the case where the initial state is high. This signifies that, depending on whether the initial state is high or low, the frequency-divided clock signal being outputted from the TFF becomes different in phase, resulting in indefinite phase relationship. Namely, when the initial state is low, the phase is inverted based on an input clock signal, while when the initial state is high, the phase remains the same (non-inverting) as the phase of the input clock signal (not inverted), so that the logic as to whether or not it is inverted or non-inverting becomes indefinite.

Accordingly, in some cases the initial states of the TFF2 and TFF3 are opposite to each other, wherein, the phase of either one of the frequency-divided clock signals is inverted, which results in the phase shift.

Incidentally description has been made about the phase shift attributed to the phase inversion relationship between the TFF2 and TFF3 in the output frequency-divided clock signals, wherein the same applies also in the case of the TFF4-TFF7.

Such being the case, it has been found out that it would make difficulties to realize a multiphase clock generator circuit to be provided in a signal multiplexing circuit for multiplexing data signals of the channels more than 4 in number, by configuring only using the TFF circuits as shown in FIG. 5.

Although a technique disclosed in the above Japanese Patent Laid-Open (Kokai) Hei 5-037315 is not directed to the technique to solve the above-mentioned problem in case of configuring a multiphase clock generator circuit, it is conceivable, for the purpose of solving the above-mentioned problem, to configure a TFF provided with a reset input, and set both Q outputs to the high level based on the supply timing of an initial set signal, as described in Japanese Patent Laid-Open (Kokai) Hei 5-037315. However, it is difficult to realize this since the timing to reset each TFF would be difficult of being made. For example, there would be inputted ⅛ frequency-divided clock signals mutually having a phase difference of 45°, as clock signal, into four TFFs generating a 1/16 frequency-divided clock signal, but it is not possible to reset each TFF with each timing.

The present invention has been devised in view of the above problems, and it is an object of the invention to provide clock generator circuit, signal multiplexing circuit and optical transmitter, and clock generation method, achieving data signal multiplexing for the channels of more than four in number in the generating of a frequency-divided clock signal using toggle flip-flop circuits (TFF), while avoiding the occurrence of the phase shift relationship between generated frequency-divided clock signals attributed to the indefinite initial state which is the inherent problem of the TFF.

For this purpose, a clock generator circuit in accordance with the present invention includes: a plurality of toggle flip-flop circuits connected in series, capable of outputting a pair of frequency-divided clock signals with different phases; and a delay circuit connected to each of the toggle flip-flop circuits, capable of outputting a clock signal with a phase shifted with respect to the phases of the pair of frequency-divided clock signals by delaying either one or both of the pair of frequency-divided clock signals being outputted from the toggle flip-flop circuits.

A signal multiplexing circuit according to the present invention includes the aforementioned clock generator circuit; and a plurality of selector circuits for multiplexing two data signals, based on each of the plurality of frequency-divided clock signals generated by the clock generator circuit.

An optical transmitter according to the present invention includes the aforementioned signal multiplexing circuit; an amplifier circuit which amplifies an output of the signal multiplexing circuit; and a modulation circuit which modulates an optical signal in response to an output of the amplifier circuit.

A clock generator circuit according to the present invention includes: a first clock signal generator circuit having a first toggle flip-flop circuit which generates a pair of frequency-divided clock signals with different phases; and a second clock signal generator circuit including a second toggle flip-flop circuit which generates a pair of frequency-divided clock signals with different phases by frequency dividing either one of the pair of frequency-divided clock signals generated by the first toggle flip-flop circuit. The second clock signal generator circuit includes a delay flip-flop circuit connected in parallel to the second toggle flip-flop circuit, and based on the other frequency-divided clock signal generated by the first toggle flip-flop circuit, the delay flip-flop circuit generates another pair of frequency-divided clock signals with different phases by delaying either one of the pair of frequency-divided clock signals generated by the second toggle flip-flop circuit.

A clock generation method according to the present invention includes the steps of: generating, as a first clock signal, a pair of frequency-divided clock signals with different phases by means of a first toggle flip-flop circuit; and generating, as a second clock signal, a pair of frequency-divided clock signals with different phases by frequency dividing either one of the pair of frequency-divided clock signals generated by the first toggle flip-flop circuit by means of a second toggle flip-flop circuit, and generating, as the second clock signal, another pair of frequency-divided clock signals with different phases by delaying either one of the pair of frequency-divided clock signals generated by the second toggle flip-flop circuit based on the other frequency-divided clock signal generated by the first toggle flip-flop circuit, by means of a delay flip-flop circuit connected in parallel to the second toggle flip-flop circuit.

Thus, according to the clock generator circuit, the signal multiplexing circuit and the optical transmitter, and the clock generation method in accordance with the present invention, there is an advantage of enabling realization of multiplexing the data signals of the channels more than four in number, in the generating of a frequency-divided clock signal using toggle flip-flop circuits (TFF), while avoiding the occurrence of the phase shift relationship between generated frequency-divided clock signals attributed to the indefinite initial state which is the inherent problem of the TFF.

BRIEF DESCRIPTION OF THE DRAWINGS

FIG. 6(a)-FIG. 6(i) show the logic charts to explain a problematic issue in the clock generator circuit having the configuration shown in FIG. 5.

FIG. 7(A)-FIG. 7(D) show a configuration diagram and logic charts to explain a problematic issue of a toggle flip-flop circuit.

DESCRIPTION OF THE PREFERRED EMBODIMENTS

A clock generator circuit, a signal multiplexing circuit and an optical transmitter, and a clock generation method according to the present invention are described hereinafter, referring to the charts and drawings.

First Embodiment

First, the clock generator circuit and the clock generation method according to the first embodiment of the present invention will be described, referring to FIG. 1 and FIG. 2(a)-FIG. 2(h).

The clock generator circuit according to the present invention is a multiphase clock generator circuit generating a plurality of clock signals with different phases.

Hereafter, as the clock generator circuit applicable to an 8:1 multiplexer circuit, a clock generator circuit capable of generating ⅛ frequency-divided clock signals with four phases, and ¼ frequency-divided clock signal with two phases is taken as an example, and the present clock generator circuit and a clock generation method are described.

Figure 1:
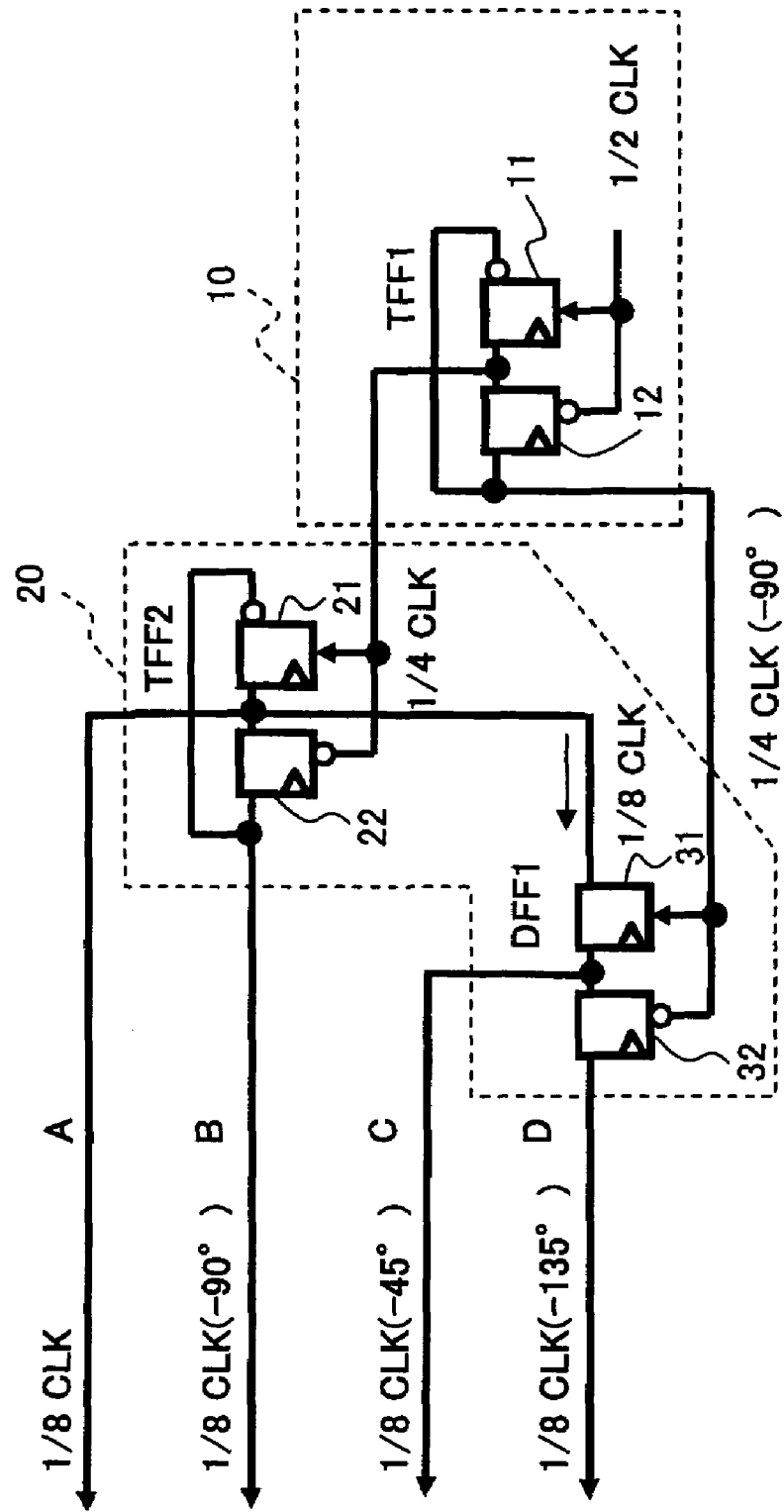
FIG. 1 shows a schematic diagram illustrating the configuration of a clock generator circuit according to a first embodiment of the present invention.

The present clock generator circuit is constituted of a plurality (here, two) of toggle flip-flop circuits (TFFs, ½ frequency dividing circuits) TFF1, TFF2 capable of outputting a pair of frequency-divided clock signals; and a delay flip-flop circuit (DFF, delay circuit) DFF1 capable of outputting a pair of frequency-divided clock signals having different phases (here, the phase difference is π/2), as exemplarily shown in FIG. 1.

Here, as shown in FIG. 1, the TFF1 is provided with a latch circuit (a first latch circuit; here, D latch) 11 and a latch circuit (a second latch circuit; D latch) 12, which are configured in such a way that the output signal of the latch circuit 11 is inputted to the latch circuit 12, and the output signal of the latch circuit 12 is fed back and inputted, as an inverted input, to the latch circuit 11.

Further, a clock signal (½ CLK) is inputted to the latch circuit 11 as clock input for a rising-edge trigger, and a clock signal (½ CLK) is inputted to the latch circuit 12 as clock input for a falling-edge trigger. Additionally, in the pre-stage of the TFF1, a clock signal source (for example, TFF or the like) capable of supplying ½ CLK clock signals is provided.

Further, the TFF1 is configured to output an output clock signal (a first frequency-divided clock signal; ¼ CLK) and an output clock signal [a second frequency-divided clock signal; ¼ CLK (−90°)], based on a pair of input clock signals (½ CLK).

Figure 2:
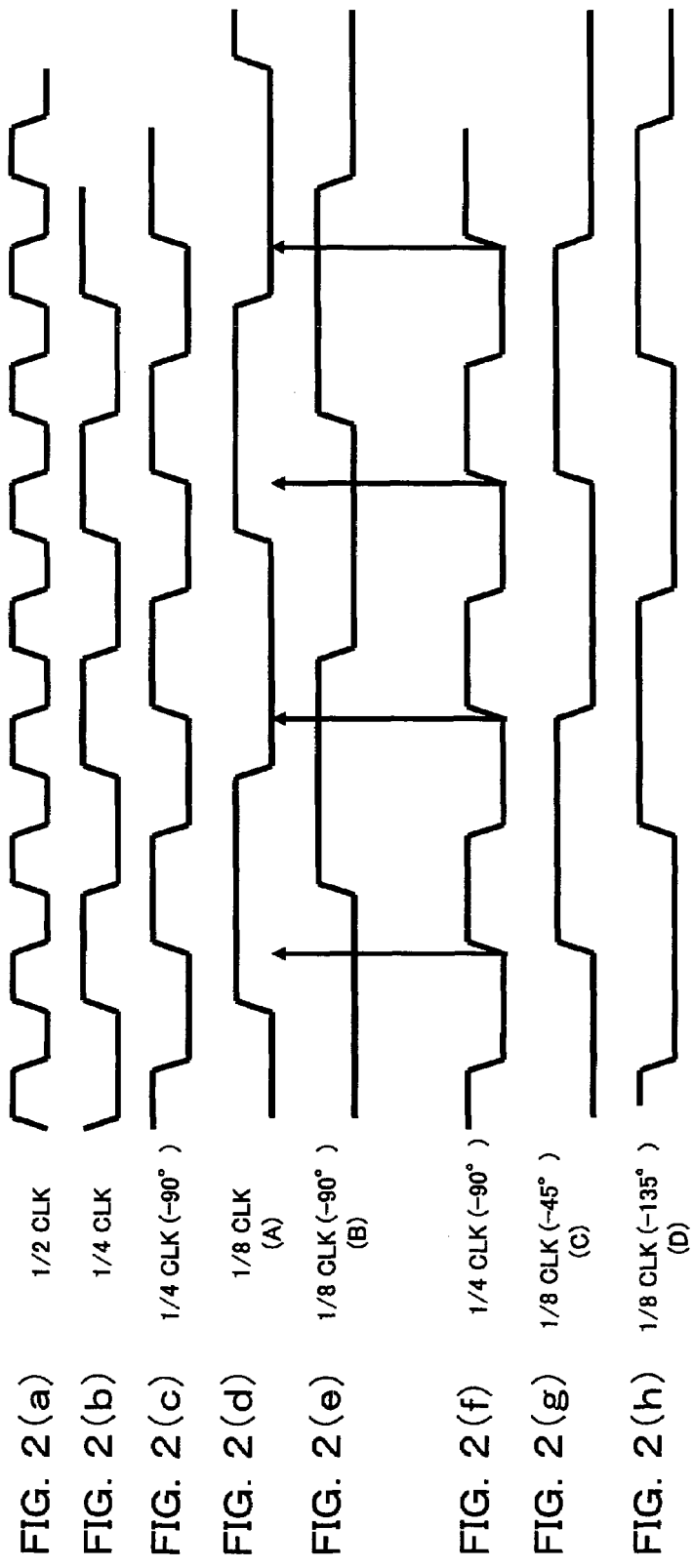
FIG. 2(a)-FIG. 2(h) show the logic charts of the frequency-divided clock signals generated from a clock generator circuit according to a first embodiment of the present invention.

That is to say, the latch circuit 11 of the TFF1 outputs the output clock signal [the first frequency-divided clock signal; ¼ CLK; refer to FIG. 2(b)] which is produced by ½ frequency-dividing the input clock signal [½ CLK; refer to FIG. 2(a)], and that the latch circuit 12 outputs the output clock signal [the second frequency-divided clock signal; ¼ CLK (−90°); refer to FIG. 2(c)] which is produced by ½ frequency-dividing the inverted input clock signal [½ CLK; refer to FIG. 2(a)].

Here, as shown in FIG. 2(b) and FIG. 2(c), the first frequency-divided clock signal (¼ CLK) being outputted from the latch circuit 11 and the second frequency-divided clock signal [¼ CLK (−90°)] being outputted from the latch circuit 12 have a π/2-phase shift with respect to each other. Namely, ¼ frequency-divided clock signals with two phases having the same frequency with a phase shift of π/2 are outputted from the TFF1.

Additionally, in the present clock generator circuit, the portion of generating the ¼ frequency-divided clock signal with two phases (namely, a pair of frequency-divided clock signals with different phases) by means of the above TFF1 (the first toggle flip-flop circuit) is referred to as a ¼ frequency-divided clock signal generator circuit 10 (a first clock signal generator circuit, a first clock signal generation step in a clock generation method).

As shown in FIG. 1, the TFF2 is provided with a latch circuit (a first latch circuit; here, D latch) 21 and a latch circuit (a second latch circuit, D latch) 22, which are configured in such a way that the output signal of the latch circuit 21 is inputted to the latch circuit 22, and the output signal of the latch circuit 22 is fed back and inputted, as an inverted input, to the latch circuit 21.

Here, the TFF2 is connected in series with the TFF1, and the frequency-divided clock signal (a first input clock signal; ¼ CLK) being outputted from the latch circuit 11 of the TFF1 is inputted to the latch circuit 21 of the TFF1 as clock input for a rising-edge trigger, and also, the frequency-divided clock signal [a first clock input signal; ¼ CLK] being outputted from the latch circuit 11 of the TFF1 is inputted (an inverted input) to the latch circuit 22 as clock input for a falling-edge trigger.

Additionally, the TFF1 is also referred to as a pre-stage toggle flip-flop circuit (pre-stage TFF) because it is provided in the pre-stage, while the TFF2 is also referred to as a post-stage toggle flip-flop circuit (post-stage TFF) because it is provided in the post-stage.

Such being the case, the arrangement is made such that one frequency-divided clock signal (¼ CLK) of the pair of the frequency-divided clock signals (having a phase difference of $\pi/2$ relative to each other, here) being outputted from the TFF1 is inputted to the TFF2, as clock input.

Further, the TFF2 is configured to output an output clock signal (a first frequency-divided clock signal; ⅛ CLK; refer to a symbol A in FIG. 1) and an output clock signal [a second frequency-divided clock signal; ⅛ CLK (-90°); refer to a symbol B in FIG. 1], based on a pair of input clock signals (¼ CLK).

That is to say, the latch circuit 21 of the TFF2 outputs the output clock signal [the first frequency-divided clock signal; ⅛ CLK; refer to FIG. 2(d)] which is produced by ½ frequency-dividing the input clock signal [¼ CLK; refer to FIG. 2(b)]; and the latch circuit 22 outputs the output clock signal [the second frequency-divided clock signal; ⅛ CLK (-90°); refer to FIG. 2(e)] which is produced by ½ frequency-dividing the inverted input clock signal [¼ CLK; refer to FIG. 2(b)].

Here, as shown in FIG. 2(d) and FIG. 2(e), the first frequency-divided clock signal (⅛ CLK) being outputted from the latch circuit 21 and the second frequency-divided clock signal [⅛ CLK (-90°)] being outputted from the latch circuit 22 have a phase shift of $\pi/2$ relative to each other.

As shown in FIG. 1, a DFF1 is provided with a latch circuit (a third latch circuit; here, D latch) 31 and a latch circuit (a fourth latch circuit; here, D latch) 32, which are configured in such a way that the output signal of the latch circuit 31 is inputted to the latch circuit 32.

Here, as shown in FIG. 1, the DFF1 is connected in series with the TFF1, and the frequency-divided clock signal [a second input clock signal; ¼ CLK (-90°)] being outputted from the latch circuit 12 of the TFF1 is inputted to the latch circuit 31 of the DFF1 as clock input for a rising-edge trigger, and also, the frequency-divided clock signal [the second clock input signal; ¼ CLK (-90°)] being outputted from the latch circuit 12 of the TFF1 is inputted (an inverted input) to the latch circuit 32 as clock input for a falling-edge trigger.

Additionally, the second input clock signal [¼ CLK (-90°)] and the above-mentioned first clock input signal (¼ CLK) have a phase shift of $\pi/2$ relative to each other.

Such being the case, the arrangement is made such that the other frequency-divided clock signal [¼ CLK (-90°)] of the pair of the frequency-divided clock signals (having a phase difference of $\pi/2$ relative to each other, here) being outputted from the TFF1 is inputted to the DFF1, as clock input.

Further, as shown in FIG. 1, the DFF1 is connected in parallel to the TFF2, and the output signal (the frequency-divided clock signal; ⅛ CLK) being outputted from the latch circuit 21 of the TFF2 is inputted to the latch circuit 31 of the DFF1, as data input.

Such being the case, the arrangement is made such that either one frequency-divided clock signal (a reference clock signal; here, ⅛ CLK) of the pair of the frequency-divided clock signals (having a phase difference of $\pi/2$ relative to each other, here) being outputted from the TFF2 is inputted to the DFF1, as data input.

Further, the DFF1 is configured to output an output clock signal [a third frequency-divided clock signal; ⅛ CLK (-45°); refer to a symbol C in FIG. 1] and an output clock signal [a fourth frequency-divided clock signal; ⅛ CLK (-135°); refer to a symbol D in FIG. 1], based on the pair of input clock signals [¼ CLK (-90°)] and the reference clock signal (⅛ CLK; refer to a symbol A in FIG. 1).

Namely, the latch circuit 31 of the DFF1 outputs the output clock signal [the third frequency-divided clock signal; ⅛ CLK (-45°); refer to FIG. 2(g)] by retiming the reference clock signal [⅛ CLK; refer to FIG. 2(d)] based on the input clock signal [¼ CLK (-90°); refer to FIG. 2(f)], and the latch circuit 32 outputs the output clock signal [the fourth frequency-divided clock signal; ⅛ CLK (-135°); refer to FIG. 2(h)] by retiming the reference clock signal [⅛ CLK; refer to FIG. 2(d)] based on the inverted input clock signal [¼ CLK (-90°); refer to FIG. 2(f)].

Additionally, here, it is configured that the frequency-divided clock signal (⅛ CLK) being outputted from the latch circuit 21 of the TFF2 is inputted to the latch circuit 31 of the DFF1, as data input. However, it is not limited to the above. The arrangement may also be made such that the frequency-divided clock signal [⅛ CLK (-90°)] being outputted from the latch circuit 22 of the TFF2 is inputted to the latch circuit 31 of the DFF1, as data input, and the inverted signal of the frequency-divided clock signal [¼ CLK (-90°)] being outputted from the TFF1 is inputted to the latch circuit 31 of the DFF1 as clock signal, and further, the frequency-divided clock signal [¼ CLK (-90°)] being outputted from the TFF1 is inputted to the latch circuit 32 of the DFF1 as clock signal, thus producing the output of the latch circuit 31 to be ⅛ CLK (-135°), and the output of the latch circuit 32 to be ⅛ CLK (-45°).

Here, as shown in FIG. 2(g) and FIG. 2(h), the third frequency-divided clock signal [⅛ CLK (-45°)] being outputted from the latch circuit 31 and the fourth frequency-divided clock signal [⅛ CLK (-135°)] being outputted from latch circuit 32 have a phase shift of $\pi/2$ relative to each other. Also, as shown in FIG. 2(d) and FIG. 2(g), the phase of the third frequency-divided clock signal [⅛ CLK (-45°)] being outputted from the latch circuit 31 is shifted by $\pi/4$ with respect to the phase of the first frequency-divided clock signal (⅛ CLK) being outputted from the latch circuit 21. Further, as shown in FIG. 2(e) and FIG. 2(h), the phase of the fourth frequency-divided clock signal [⅛ CLK (-135°)] being outputted from the latch circuit 32 is shifted by $\pi/4$ with respect to the phase of the second frequency-divided clock signal [⅛ CLK (-90°)] being outputted from the latch circuit 22.

In short, as shown in FIGS. 2(d), 2(e), 2(g) and 2(h), ⅛ frequency-divided clock signals with four phases having the same frequency with a phase shift of $\pi/4$ relative to each other are outputted from the DFF1 and the TFF2.

Additionally, in this clock generator circuit, the portion of generating the ⅛ frequency-divided clock signals with four (4) phases is referred to as a ⅛ frequency-divided clock signal generator circuit 20 (a second clock signal generator circuit, a second clock signal generation step of the clock generation method), which generates ⅛ frequency-divided clock signals with two phases in this TFF2 (the second toggle flip-flop circuit) [i.e. generates a pair of frequency-divided clock signals with different phases by frequency dividing either one of the pair of the frequency-divided clock signals generated by the TFF1 (the first toggle flip-flop circuit)]; and also generates ⅛ frequency-divided clock signals with four phases by generating other ⅛ frequency-divided clock signals with two phases in the DFF1 being connected in parallel to the TFF2 (i.e. by generating another pair of frequency-divided clock signals with different phases by delaying either one frequency-divided clock signal of the pair of frequency-divided clock signals generated by the TFF2, based on the other frequency-divided clock signal generated by the TFF1).

Such being the case, according to the present embodiment, the arrangement is made such that two frequency-divided clock signals [⅛ CLK, ⅛ CLK (−90°)] with different phases are generated by the TFF2, and further, by retiming in the DFF1 the frequency-divided clock signal [⅛ CLK or ⅛ CLK (−90°)] being outputted from the TFF2 for use as reference clock signal, two frequency-divided clock signals [⅛ CLK (−45°), ⅛ CLK (−135°)] with different phases are generated. Namely, according to the present embodiment, the logic of the frequency-divided clock signals [⅛ CLK (−45°), ⅛ CLK (−135°)] being outputted from the DFF1 is determined based on the logic state of the frequency-divided clock signal [⅛ CLK or ⅛ CLK (−90°)] being outputted from the TFF2. Thereby, it becomes possible to generate a multiphase (here, four-phase) clock signal group of equal logic, while avoiding logic inversion [refer to FIG. 6(a)-FIG. 6(i)] which has posed problems in the configuring of a multiphase clock generator circuit using the TFF.

Further, the TFF1 and TFF2 also have a problem that the initial states thereof are indefinite. However, even when the phases of the output frequency-divided clock signals become different depending on the initial state of either being high or low in these TFF1 and TFF2, every frequency-divided clock signal becomes inverted in phase, so that no phase shift is produced, and no problem occurs.

Therefore, according to the clock generator circuit of the present embodiment, there is an advantage of achieving data signal multiplexing for the channels more than four (4) in number, in the generating of multiphase frequency-divided clock signals using toggle flip-flop circuits (TFF), while avoiding the occurrence of the phase shift relationship between each generated frequency-divided clock signal, caused by the inherent problem such that the TFF has an indefinite initial state.

Also, no provision of, for example, a reset circuit is necessary. Further, using a delay flip-flop circuit (DFF) having two latch circuits connected in series, the basic latch circuits are the same in total number as in the case that the entire configuration is constituted of the TFF. Therefore, no increases in the circuit size and power consumption will arise, and high-speed operation can be achieved.

Second Embodiment

Next, a clock generator circuit and a clock generation method according to a second embodiment will be described, referring to FIG. 3.

The clock generator circuit (multiphase clock generator circuit, clock generation method) according to the present embodiment differs from the above-mentioned clock generator circuit according to the first embodiment, in that the clock generator circuit (clock generation method) according to the first embodiment is applicable to, for example, an 8:1 multiplexer circuit, while the clock generator circuit (clock generation method) of the present embodiment is applicable to, for example, a 16:1 multiplexer circuit. In other words, there is difference in that the clock generator circuit according to the above-mentioned first embodiment is a clock generator circuit capable of generating ⅛ frequency-divided clock signals with four (4) phases and ¼ frequency-divided clock signals with two (2) phases, while the clock generator circuit according to the present embodiment (clock generation method) is capable of generating 1/16 frequency-divided clock signals with eight (8) phases, ⅛ frequency-divided clock signals with four (4) phases, and ¼ frequency-divided clock signals with two (2) phases.

Figure 3:
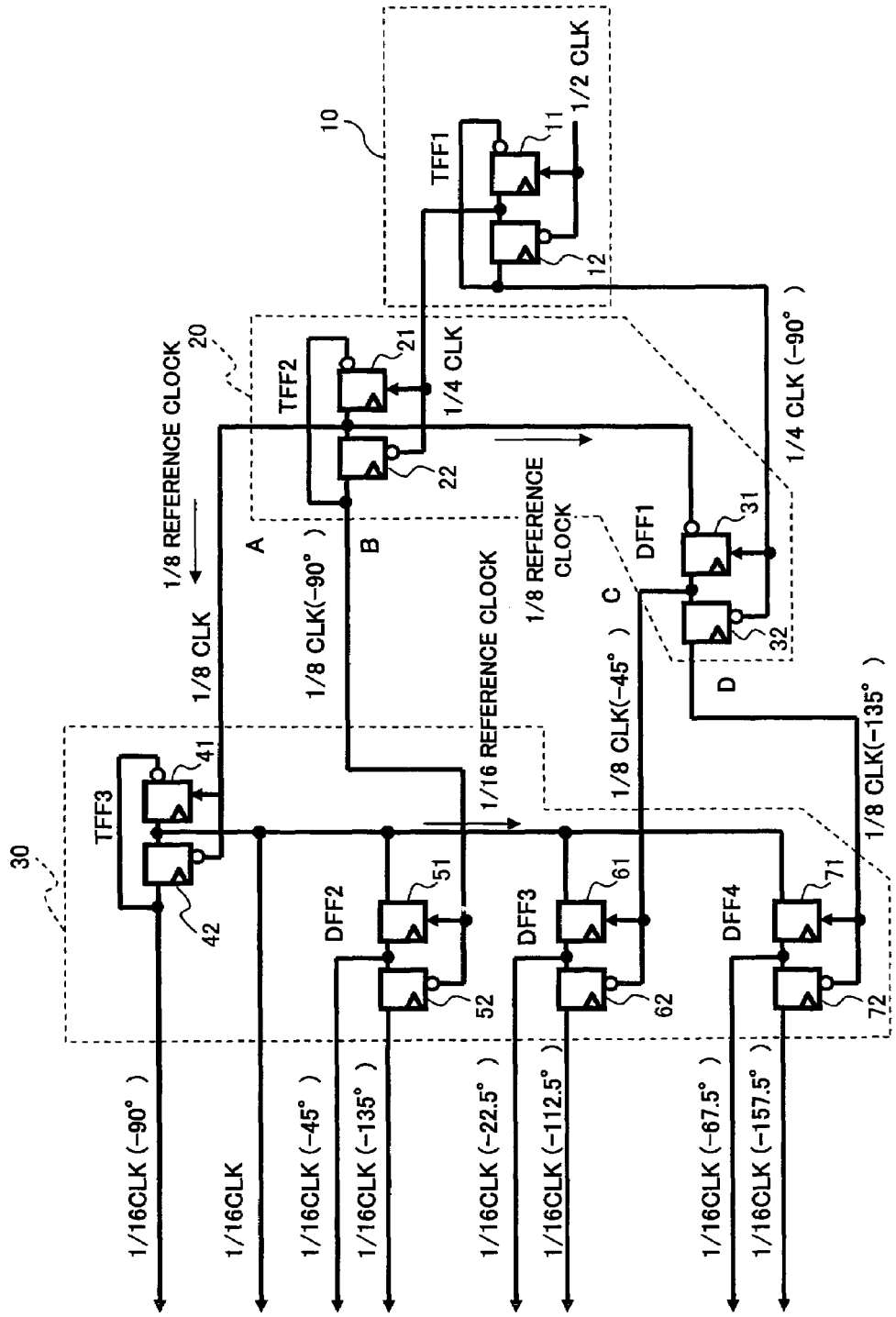
FIG. 3 shows a schematic diagram illustrating the configuration of a clock generator circuit according to a second embodiment of the present invention.

This clock generator circuit is further constituted of a plurality (here, two) of toggle flip-flop circuits (TFF, ½ frequency dividing circuit) TFF3 capable of outputting a pair of frequency-divided clock signals with different phases (here, the phase difference is π/2); and a delay flip-flop circuits (DFF, delay circuits) DFF2, DFF3 and DFF4, capable of outputting a pair of frequency-divided clock signals having different phases (here, the phase difference is π/2), in addition to the above-mentioned clock generator circuit of the first embodiment, as exemplarily shown in FIG. 3.

Here, in FIG. 3, as to the configurations of the TFF1, TFF2 and DFF1, the relation of connection therebetween, and the frequency-divided clock signal phases being outputted from these circuits, the descriptions being the same as the above on the first embodiment are to be made, and therefore the descriptions related thereto will be omitted here. In the following, the descriptions will mainly focus attention on the configurations of the TFF2, DFF2, DFF3 and DFF4, the relation of connection therebetween, and the frequency-divided clock signal phases being outputted from these circuits.

Here, as shown in FIG. 3, the TFF3 is provided with a latch circuit (a first latch circuit; here, D latch) 41 and a latch circuit (a second latch circuit; D latch) 42, which are configured in such a way that the output signal of the latch circuit 41 is inputted to the latch circuit 42, and the output signal of the latch circuit 42 is fed back and inputted, as an inverted input, to the latch circuit 41.

Here, as shown in FIG. 3, the TFF3 is connected in series with the TFF2, and the frequency-divided clock signal (a first input clock signal; ⅛ CLK) being outputted from the latch circuit 21 of the TFF2 is inputted to the latch circuit 41 of the TFF3 as clock input for a rising-edge trigger, and also, the frequency-divided clock signal [a first clock input signal; ⅛ CLK] being outputted from the latch circuit 21 of the TFF2 is inputted (an inverted input) to the latch circuit 42 as clock input for a falling-edge trigger.

Additionally, the TFF2 is also referred to as a pre-stage toggle flip-flop circuit (pre-stage TFF) because it is provided in the pre-stage, while the TFF3 is also referred to as a post-stage toggle flip-flop circuit (post-stage TFF) because it is provided in the post-stage.

Such being the case, the arrangement is made such that one frequency-divided clock signal (⅛ CLK) of the pair of the frequency-divided clock signals (having a phase difference of π/2 relative to each other, here) being outputted from the TFF2 is inputted to the TFF3, as clock input.

Further, the TFF3 is configured to output an output clock signal (a first frequency-divided clock signal; 1/16 CLK) and an output clock signal [a second frequency-divided clock signal; 1/16 CLK (−90°)], based on a pair of input clock signals (⅛ CLK).

That is to say, the latch circuit 41 of the TFF3 outputs the output clock signal (the first frequency-divided clock signal; 1/16 CLK) which is produced by ½ frequency-dividing the input clock signal (⅛ CLK); and the latch circuit 42 outputs the output clock signal [the second frequency-divided clock signal; 1/16 CLK (−90°)] which is produced by ½ frequency-dividing the inverted input clock signal (⅛ CLK).

Here, the first frequency-divided clock signal (1/16 CLK) being outputted from the latch circuit 41 and the second frequency-divided clock signal [1/16 CLK (−90°)] being outputted from the latch circuit 42 have a phase shift of π/2 relative to each other.

As shown in FIG. 3, the DFF2 is provided with a latch circuit (a third latch circuit; here, D latch) 51 and a latch circuit (a fourth latch circuit; here, D latch) 52, which are configured in such a way that the output signal of the latch circuit 51 is inputted to the latch circuit 52.

Here, as shown in FIG. 3, the DFF2 is connected in series with the TFF2, and the frequency-divided clock signal [a second input clock signal; ⅛ CLK (−90°)] being outputted from the latch circuit 22 of the TFF2 is inputted to the latch circuit 51 of the DFF2 as clock input for a rising-edge trigger. Also, the frequency-divided clock signal [the second clock input signal; ⅛ CLK (−90°)] being outputted from the latch circuit 22 of the TFF2 is inputted (an inverted input) to the latch circuit 52 as clock input for a falling-edge trigger.

Additionally, the phase of the second input clock signal [⅛ CLK (−90°)] is shifted by π/2 with respect to the phase of the above-mentioned first clock input signal (⅛ CLK).

Such being the case, the arrangement is made such that the other frequency-divided clock signal [⅛ CLK (−90°)] of the pair of the frequency-divided clock signals (having a phase difference of π/2 relative to each other, here) being outputted from the TFF2 is inputted to the DFF2, as clock input.

Further, as shown in FIG. 3, the DFF2 is connected in parallel to the TFF3, and the output signal (the frequency-divided clock signal; 1/16 CLK) being outputted from the latch circuit 41 of the TFF3 is inputted to the latch circuit 51 of the DFF2, as data input.

Such being the case, the arrangement is made such that either one frequency-divided clock signal (the reference clock signal; here, 1/16 CLK) of the pair of the frequency-divided clock signals (having a phase difference of π/2 relative to each other, here) being outputted from the TFF3 is inputted to the DFF2, as data input.

Further, the DFF2 is configured to output an output clock signal [a third frequency-divided clock signal; 1/16 CLK (−45°)] and an output clock signal [a fourth frequency-divided clock signal; 1/16 CLK (−135°)], based on the pair of input clock signals [⅛ CLK (−90°)] and the reference clock signal (1/16 CLK).

Namely, the latch circuit 51 of the DFF2 outputs the output clock signal [the third frequency-divided clock signal; 1/16 CLK (−45°)] by retiming the reference clock signal (1/16 CLK) based on the input clock signal [⅛ CLK (−90°)], and the latch circuit 52 outputs the output clock signal [the fourth frequency-divided clock signal; 1/16 CLK (−135°)] by retiming the reference clock signal (1/16 CLK) based on the inverted input clock signal [⅛ CLK (−90°)].

Here, the 1/16 CLK (−45°) (the third frequency-divided clock signal) being outputted from the latch circuit 51 and the 1/16 CLK (−135°) (the fourth frequency-divided clock signal) being outputted from the latch circuit 52 have a phase shift of π/2 relative to each other. Further, the phase of the 1/16 CLK (−45°) (the third frequency-divided clock signal) being outputted from the latch circuit 51 is shifted by π/4 with respect to the phase of the 1/16 CLK (the first frequency-divided clock signal) being outputted from the latch circuit 41, and also, the phase of the 1/16 CLK (−135°) (the fourth frequency-divided clock signal) being outputted from the latch circuit 52 is shifted by π/4 with respect to the phase of the 1/16 CLK (−90°) (the second frequency-divided clock signal) being outputted from the latch circuit 42.

Additionally, here, it is configured that the frequency-divided clock signal (1/16 CLK) being outputted from the latch circuit 41 of the TFF3 is inputted to the latch circuit 51 of the DFF2, as data input. However, it is not limited to the above. The arrangement may also be made such that the frequency-divided clock signal [1/16 CLK (−90°)] being outputted from the latch circuit 42 of the TFF3 is inputted to the latch circuit 51 of the DFF2, as data input, and the inverted signal of the frequency-divided clock signal [⅛ CLK (−90°)] being outputted from the TFF2 is inputted to the latch circuit 51 of the DFF2 as clock signal, and further, the frequency-divided clock signal [⅛ CLK (−90°)] being outputted from the TFF2 is inputted to the latch circuit 52 of the DFF2 as clock signal, thus producing the output of the latch circuit 51 to be 1/16 CLK (−135°), and the output of the latch circuit 52 to be 1/16 CLK (−45°).

Such being the case, according to the present embodiment, the arrangement is made such that two frequency-divided clock signals [1/16 CLK, 1/16 CLK (−90°)] with different phases are generated by the TFF3, and further, by retiming in the DFF2 the frequency-divided clock signal [1/16 CLK or 1/16 CLK (−90°)] being outputted from the TFF3 for use as reference clock signal, two frequency-divided clock signals [1/16 CLK (−45°), 1/16 CLK (−135°)] with different phases are generated.

Similarly, as shown in FIG. 3, the DFF3 is provided with a latch circuit (a third latch circuit; here, D latch) 61 and a latch circuit (a fourth latch circuit; here, D latch) 62, which are configured in such away that the output signal of the latch circuit 61 is inputted to the latch circuit 62.

Here, as shown in FIG. 3, the DFF3 is connected in series with the DFF2, and the frequency-divided clock signal [a second input clock signal; ⅛ CLK (−45°)] being outputted from the latch circuit 31 of the DFF1 is inputted to the latch circuit 61 of the DFF3 as clock input for a rising-edge trigger, and also, the frequency-divided clock signal [the second clock input signal; ⅛ CLK (−45°)] being outputted from the latch circuit 31 of the DFF1 is inputted (an inverted input) to the latch circuit 62 as clock input for a falling-edge trigger.

Additionally, the phase of the second input clock signal [⅛ CLK (−45°)] is shifted by π/4 with respect to the phase of the above-mentioned first clock input signal (⅛ CLK)

Such being the case, the arrangement is made such that the other frequency-divided clock signal [⅛ CLK (−45°)] out of the pair of the frequency-divided clock signals (having a phase difference of π/2 relative to each other, here) being outputted from the DFF1 is inputted to the DFF3, as clock input.

Further, as shown in FIG. 3, the DFF3 is connected in parallel to the TFF3, and the output signal (the frequency-divided clock signal; 1/16 CLK) being outputted from the latch circuit 41 of the TFF3 is inputted to the latch circuit 61 of the DFF3, as data input.

Such being the case, the arrangement is made such that either one frequency-divided clock signal (the reference clock signal; here, 1/16 CLK) out of the pair of the frequency-divided clock signals (having a phase difference of π/2 relative to each other, here) being outputted from the TFF3 is inputted to the DFF3, as data input.

Further, the DFF3 is configured to output an output clock signal [a third frequency-divided clock signal; 1/16 CLK (−22.5°)] and an output clock signal [a fourth frequency-divided clock signal; 1/16 CLK (−112.5°)], based on the pair of input clock signals [⅛ CLK (−45°)] and the reference clock signal (1/16 CLK).

Namely, the latch circuit 61 of the DFF3 outputs the output clock signal [the third frequency-divided clock signal; 1/16 CLK (−22.5°)] by retiming the reference clock signal (1/16 CLK) based on the input clock signal [⅛ CLK (−45°)], and the latch circuit 62 outputs the output clock signal [the fourth frequency-divided clock signal; 1/16 CLK (−112.5°)] by retiming the reference clock signal (1/16 CLK) based on the inverted input clock signal [⅛ CLK (−45°)].

Here, the 1/16 CLK (−22.5°) (the third frequency-divided clock signal) being outputted from the latch circuit 61 and the 1/16 CLK (−112.5°) (the fourth frequency-divided clock signal) being outputted from the latch circuit 62 have a phase shift of π/2 relative to each other. Further, the phase of the 1/16 CLK (−22.5°) (the third frequency-divided clock signal) being outputted from the latch circuit 62 is shifted by π/8 with respect to the phase of the 1/16 CLK (the first frequency-divided clock signal) being outputted from the latch circuit 41, and also, the phase of the 1/16 CLK (−112.5°) (the fourth frequency-divided clock signal) being outputted from the latch circuit 62 is shifted by π/8 with respect to the phase of the 1/16 CLK (−90°) (the second frequency-divided clock signal) being outputted from the latch circuit 42.

Such being the case, according to the present embodiment, the arrangement is made such that two frequency-divided clock signals [1/16 CLK, 1/16 CLK (−90°)] with different phases are generated by the TFF3, and further, by retiming in the DFF3 the frequency-divided clock signal [1/16 CLK or 1/16 CLK (−90°)] being outputted from the TFF3 for use as reference clock signal, two frequency-divided clock signals [1/16 CLK (−22.5°), 1/16 CLK (−112.5°)] with different phases are generated.

Additionally, here, it is configured that the frequency-divided clock signal (1/16 CLK) being outputted from the latch circuit 41 of the TFF3 is inputted to the latch circuit 61 of the DFF3, as data input. However, it is not limited to the above. The arrangement may also be made such that the frequency-divided clock signal [1/16 CLK (−90°)] being outputted from the latch circuit 42 of the TFF3 is inputted to the latch circuit 61 of the DFF3, as data input, and the inverted signal of the frequency-divided clock signal [1/8 CLK (−45°)] being outputted from the DFF1 is inputted to the latch circuit 61 of the DFF3 as clock input, and further, the frequency-divided clock signal [1/8 CLK (−45°)] being outputted from the DFF1 is inputted to the latch circuit 62 of the DFF3 as clock signal, thus producing the output of the latch circuit 61 to be 1/16 CLK (−112.5°), and the output of the latch circuit 62 to be 1/16 CLK (−22.5°).

Here, the phase of the 1/16 CLK (−22.5°) being outputted from the latch circuit 61 is shifted by π/8 with respect to the phase of the 1/16 CLK (−45°) being outputted from the latch circuit 51 of the DFF2, and also, the phase of the 1/16 CLK (−112.5°) being outputted from the latch circuit 62 is shifted by π/8 with respect to the phase of the 1/16 CLK (−135°) being outputted from the latch circuit 52 of the DFF2.

Similarly, as shown in FIG. 3, the DFF4 is provided with a latch circuit (a third latch circuit; here, D latch) 71 and a latch circuit (a fourth latch circuit; here, D latch) 72, which are configured in such away that the output signal of the latch circuit 71 is inputted to the latch circuit 72.

Here, as shown in FIG. 3, the DFF4 is connected in series with the DFF1, and the frequency-divided clock signal [a second input clock signal; 1/8 CLK (−135°)] being outputted from the latch circuit 32 of the DFF1 is inputted to the latch circuit 71 of the DFF4 as clock input for a rising-edge trigger. Also, the frequency-divided clock signal [the second clock input signal; 1/8 CLK (−135°)] being outputted from the latch circuit 32 of the DFF1 is inputted (an inverted input) to the latch circuit 72 as clock input for a falling-edge trigger.

Additionally, the phase of the second input clock signal [1/8 CLK (−135°)] is shifted by 3π/4 with respect to the phase of the above-mentioned first clock input signal (1/8 CLK).

Such being the case, the arrangement is made such that the other frequency-divided clock signal [1/8 CLK (−135°)] of the pair of the frequency-divided clock signals (having a phase difference of π/2 relative to each other, here) being outputted from the DFF1 is inputted to the DFF4, as clock input.

Further, as shown in FIG. 3, the DFF4 is connected in parallel to the TFF3, and the output signal (the frequency-divided clock signal; 1/16 CLK) being outputted from the latch circuit 41 of the TFF3 is inputted to the latch circuit 71 of the DFF4, as data input.

Such being the case, the arrangement is made such that either one frequency-divided clock signal (the reference clock signal; here, 1/16 CLK) of the pair of the frequency-divided clock signals (having a phase difference of π/2 relative to each other, here) being outputted from the TFF3 is inputted to the DFF4, as data input.

Further, the DFF4 is configured to output an output clock signal [a third frequency-divided clock signal; 1/16 CLK (−67.5°)] and an output clock signal [a fourth frequency-divided clock signal; 1/16 CLK (−157.5°)], based on the pair of input clock signals [1/8 CLK (−135°)] and the reference clock signal (1/16 CLK).

Namely, the latch circuit 71 of the DFF4 outputs the output clock signal [the third frequency-divided clock signal; 1/16 CLK (−67.5°)] by retiming the reference clock signal (1/16 CLK) based on the input clock signal [1/8 CLK (−135°)], and the latch circuit 72 outputs the output clock signal [the fourth frequency-divided clock signal; 1/16 CLK (−157.5°)] by retiming the reference clock signal (1/16 CLK) based on the inverted input clock signal [1/8 CLK (−135°)].

Additionally, here, it is configured that the frequency-divided clock signal (1/16 CLK) being outputted from the latch circuit 41 of the TFF3 is inputted to the latch circuit 71 of the DFF4, as data input. However, it is not limited to the above. The arrangement may also be made such that the frequency-divided clock signal [1/16 CLK (−90°)] being outputted from the latch circuit 42 of the TFF3 is inputted to the latch circuit 71 of the DFF4, as data input, and the inverted signal of the frequency-divided clock signal [1/8 CLK (−135°)] being outputted from the DFF1 is inputted to the latch circuit 71 of the DFF4 as clock signal, and further, the frequency-divided clock signal [1/8 CLK (−135°)] being outputted from the DFF1 is inputted to the latch circuit 72 of the DFF4 as clock signal, thus producing the output of the latch circuit 71 to be 1/16 CLK (−157.5°), and the output of the latch circuit 72 to be 1/16 CLK (−67.5°).

Here, the 1/16 CLK (−67.5°) (the third frequency-divided clock signal) being outputted from the latch circuit 71 and the 1/16 CLK (−157.7°) (the fourth frequency-divided clock signal) being outputted from the latch circuit 72 have a phase shift of π/2 relative to each other. Further, the phase of the 1/16 CLK (−67.5°) (the third frequency-divided clock signal) being outputted from the latch circuit 71 is shifted by 3π/8 with respect to the phase of the 1/16 CLK (the first frequency-divided clock signal) being outputted from the latch circuit 41, and also, the phase of the 1/16 CLK (−157.5°) (the fourth frequency-divided clock signal) being outputted from the latch circuit 72 is shifted by 3π/8 with respect to the phase of the 1/16 CLK (−90°) (the second frequency-divided clock signal) being outputted from the latch circuit 42.

Such being the case, according to the present embodiment, the arrangement is made such that two frequency-divided clock signals [1/16 CLK, 1/16 CLK (−90°)] with different phases are generated by the TFF3, and further, by retiming in the DFF4 the frequency-divided clock signal [1/16 CLK or 1/16 CLK (−90°)] being outputted from the TFF3 for use as reference clock signal, two frequency-divided clock signals [1/16 CLK (−67.5°), 1/16 CLK (−157.5°)] with different phases are generated.

Here, the phase of the 1/16 CLK (−67.5°) being outputted from the latch circuit 71 is shifted by π/8 with respect to the phase of the 1/16 CLK (−45°) being outputted from the latch circuit 51 of the DFF2, and also, the phase of the 1/16 CLK (−157.5°) being outputted from the latch circuit 72 is shifted by π/8 with respect to the phase of the 1/16 CLK (−135°) being outputted from the latch circuit 52 of the DFF2. Further, the phase of the 1/16 CLK (−67.5°) being outputted from the latch circuit 71 is shifted by π/4 with respect to the phase of the 1/16 CLK (−22.5°) being outputted from the latch circuit 61 of the DFF3, and also, the phase of the 1/16 CLK (−157.5°) being outputted from the latch circuit 72 is shifted by π/4 with respect to the phase of the 1/16 CLK (−112.5°) being outputted from the latch circuit 62 of the DFF3.

In short, 1/16 frequency-divided clock signals with eight phases having the same frequency with a phase shift of π/8 are outputted from the TFF3, DFF2, DFF3 and DFF4.

Additionally, in this clock generator circuit, the portion of generating the 1/16 frequency-divided clock signals with eight phases is referred to as a 1/16 frequency-divided clock signal generator circuit 30 (a third clock signal generator circuit, a third clock signal generation step of the clock generation method), which generates 1/16 frequency-divided clock signals with two phases by the TFF3 (the third toggle flip-flop circuit) [i.e. generates a pair of frequency-divided clock signals with different phases, based on either one of the pair of the frequency-divided clock signals generated by the TFF2 (the second toggle flip-flop circuit)); and also generates 1/16 frequency-divided clock signals with two phases respectively by the DFF2, DFF3 and DFF4 which are connected in parallel to the TFF3 [i.e. by generating another plural pairs of frequency-divided clock signals with different phases by delaying either one frequency-divided clock signal of the pair of frequency-divided clock signals generated by the TFF3, based on either one of the frequency-divided clock signals generated by the second clock signal generator circuit (the TFF2, DFF1)].

Here, the third clock signal generator circuit (the third clock signal generation step) may be a portion which generates a pair of frequency-divided clock signals with different phases by the TFF (the third toggle flip-flop circuit), based on either one frequency-divided clock signal of the pair of frequency-divided clock signals generated by the TFF2 (the second toggle flip-flop circuit) (including a case of indirect use, such as the use of a frequency-divided clock signal generated therefrom, in addition to the case of direct use); and also generates other plural pairs of frequency-divided clock signals with different phases by delaying either one frequency-divided clock signal of the plurality of frequency-divided clock signals generated by the TFF (the third toggle flip-flop circuit), using a plurality of DFFs (delay flip-flop circuits) connected in parallel to the TFF (the third toggle flip-flop circuit), based on the frequency-divided clock signals generated by the second clock signal generator circuit (TFF2, DFF1) (including a case of indirect use, such as the use of a frequency-divided clock signal generated therefrom, in addition to the case of direct use).

Accordingly, the third clock signal generator circuit (the third clock signal generation step) is not limited to the 1/16 frequency-divided clock signal generator circuit, but also includes a circuit (step) of generating more frequency-divided clock signals, like for example, a circuit of generating 1/32 frequency-divided clock signals with 16 phases, or a circuit of generating 1/64 frequency-divided clock signals with 32 phases.

In particular, as described above, according to the present embodiment, the arrangement is made such that the logic of the frequency-divided clock signals [1/16 CLK (−45°), 1/16 CLK (−135°)] being outputted from the DFF2 is determined based on the logic state of the frequency-divided clock signal [1/16 CLK or 1/16 CLK (−90°)] being outputted from the TFF3. Also, the logic of the frequency-divided clock signals [1/16 CLK (−22.5°), 1/16 CLK (−112.5°)] being outputted from the DFF3 is determined based on the logic state of the frequency-divided clock signal [1/16 CLK or 1/16 CLK (−90°)] being outputted from the TFF3. Further, the logic of the frequency-divided clock signals [1/16 CLK (−67.5°), 1/16 CLK (−157.5°)] being outputted from the DFF4 is determined based on the logic state of the frequency-divided clock signal [1/16 CLK or 1/16 CLK (−90°)] being outputted from the TFF3. Thereby, it becomes possible to generate an 8-phase clock signal group of equal logic, while avoiding logic inversion (refer to FIG. 6) which has posed problems in the configuring of a multiphase clock generator circuit using the TFF.

Further, the TFF3 also has the problem in that the initial state thereof is indefinite. However, even when the phases of the output frequency-divided clock signals become different depending on the initial state of either high or low in this TFF3, the entire frequency-divided clock signal phases become inverted, and accordingly, no phase shift is produced, and no problem occurs.

Therefore, according to the clock generator circuit and the clock generation method of the present embodiment, similar to the aforementioned first embodiment, there is an advantage of achieving data signal multiplexing for the channels more than four in number, in the generating of multiphase frequency-divided clock signals using toggle flip-flop circuits (TFF), while avoiding the occurrence of the phase shift relationship between generated frequency-divided clock signals, attributed to the indefinite initial state posing the inherent problem of the TFF.

Further, the provision of, for example, a reset circuit is unnecessary. Moreover, using a delay flip-flop circuit (DFF) having two latch circuits connected in series, the basic latch circuits are the same in total number as in the case that the entire configuration is structured by the TFF. Therefore, increases in the circuit scale and power consumption will not arise, and high-speed operation can be achieved.

Others

In the aforementioned first embodiment, the description has been made, giving an example of a clock generator circuit (clock generation method) capable of generating 1/8 frequency-divided clock signals with four phases and 1/4 frequency-divided clock signals with two phases, and also in the aforementioned second embodiment, the description has been made, taking, as an example, a clock generator circuit capable of generating 1/16 frequency-divided clock signals with eight phases, 1/8 frequency-divided clock signals with four phases, and 1/4 frequency-divided clock signals with two phases. However, the numbers of the frequency-divided clock signals to be generated are not limited to the above figures.

For example, the arrangement may be also made such that the number of the frequency-divided clock signals, having the same frequency with different phases, to be generated may be set larger. In this case, as apparent from the first embodiment and the second embodiment, depending on the number of generated phase-different frequency-divided clock signals with the same frequency, the arrangement may be made such that the number of delay flip-flop circuits being connected in parallel to the toggle flip-flop circuit is varied.

Also, although the clock generator circuit is constituted of a DFF in each of the aforementioned embodiments, it is not limited thereto, and may be configured so as to have a delay circuit which delays one or both of the pair of frequency-divided clock signals being outputted from the TFF, and thereby enables outputting as clock signal having a phase different from those of the pair of frequency-divided clock signals.

As the delay circuit, for example, a delay circuit by means of wiring, a reflective phase shifter, etc. may be listed.

Also, although in each of the aforementioned embodiments, an exemplary case of the clock generator circuit used in a multiplexer circuit has been described, the application of the present clock generator circuit is not limited thereto. For example, it is possible to apply to an AD converter circuit using a multiphase clock, which is termed time interleave method.

Further, in each of the aforementioned embodiments, the description has been made in regard to the clock generator circuit. In the event of constituting a multiplexer circuit (signal multiplexing circuit) operated by a multiphase clock, using such the clock generator circuit, in addition to the clock generator circuit according to the each of the aforementioned embodiments, there may be provided a plurality of selector circuits for multiplexing two data signals, based on each of the plurality of frequency-divided clock signals generated by the clock generator circuit. In particular, preferably, the clock generator circuit according to the above embodiments may be applied to a signal multiplexing circuit for multiplexing data signals of the channels more than four in number.

Here, the selector circuit is a circuit which selects data based on a clock signal, and generates a multiplexed signal.

Additionally, as to the configuration and the operation of the selector circuit and the signal multiplexing circuit, it is the same as described, for example, in the Japanese Patent Laid-Open (Kokai) 2004-147075.

Figure 4:
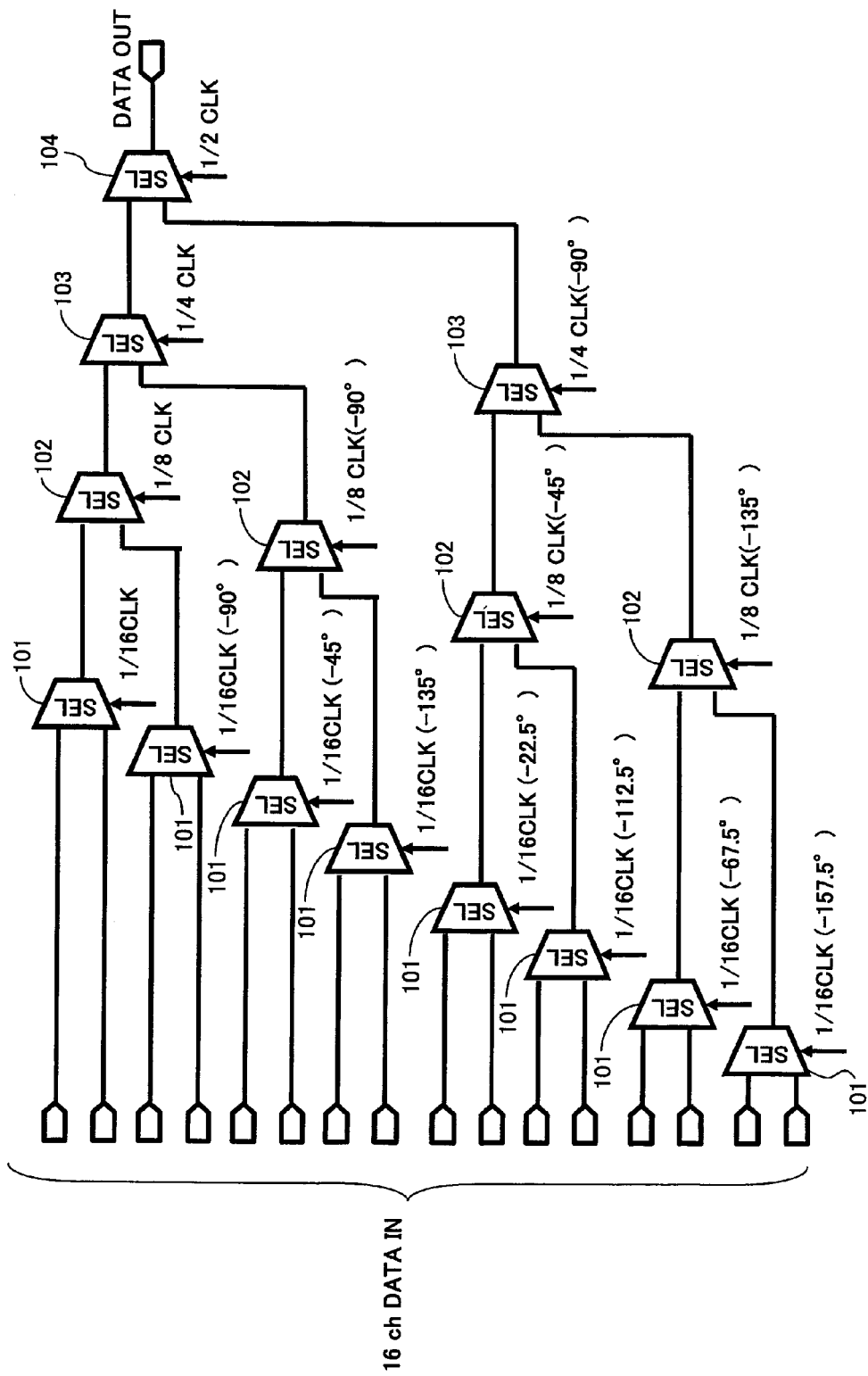
FIG. 4 shows a schematic diagram illustrating the configuration of a 16:1 multiplexer circuit (signal multiplexing circuit) by use of multiphase clocks.
Figure 5:
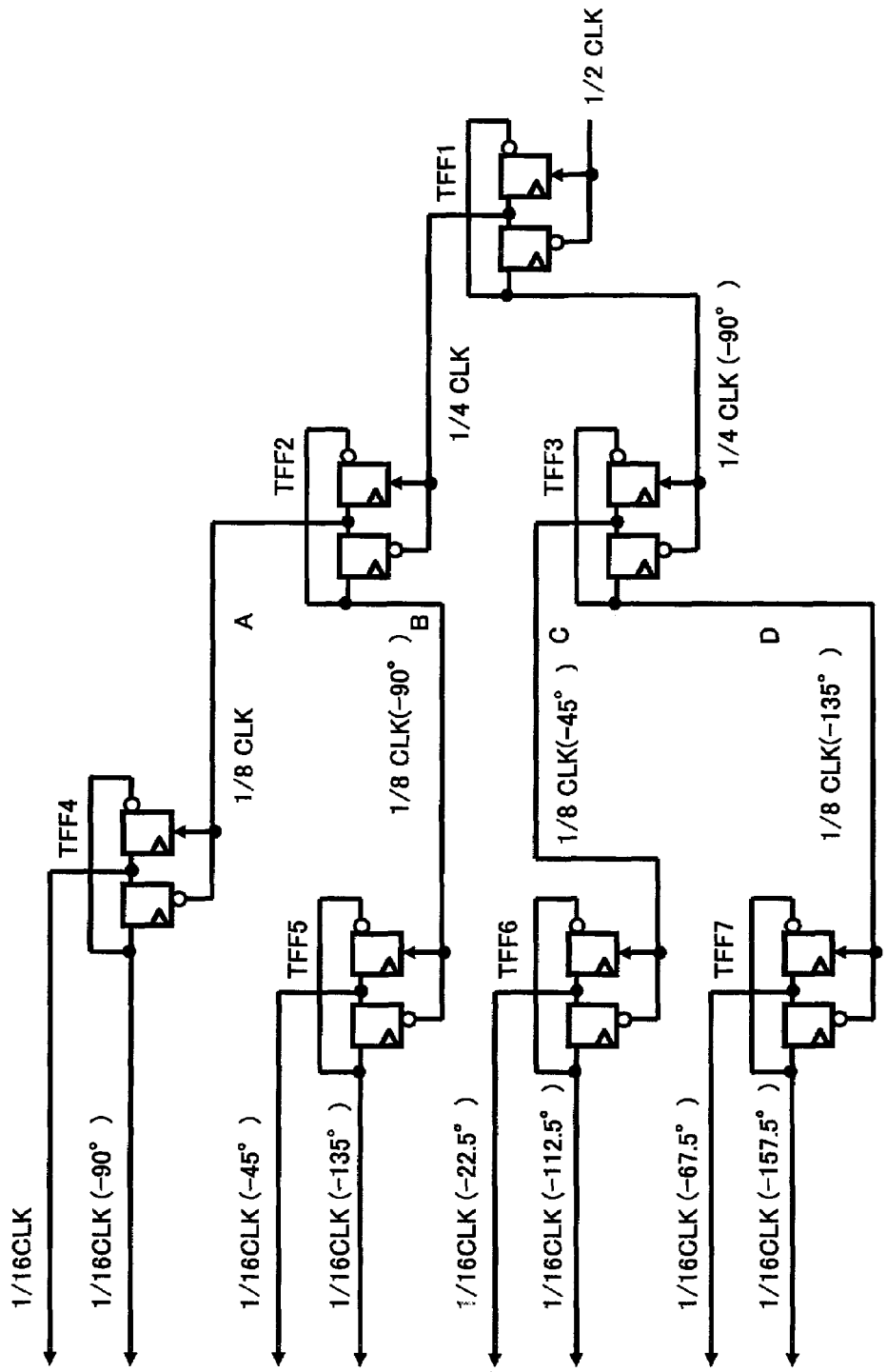
FIG. 5 shows a schematic diagram illustrating the configuration of a clock generator circuit which has been studied when devising the clock generator circuit of each embodiment of the present invention.

For example, in the event of configuring a 16:1 multiplexer circuit, as shown in FIG. 4, there are provided eight (8) first selector circuits 101 in a first stage (block) in which 16-channel data signals are multiplexed two by two; four (4) second selector circuits 102 in a second stage in which eight multiplexed data signals (multiplexed signals) being multiplexed in these eight first selector circuits 101 are multiplexed two by two; two (2) third selector circuits 103 in a third stage in which four multiplexed data signals being multiplexed in these four selector circuits 102 are multiplexed two by two; and a single fourth selector circuit 104 in a fourth stage in which two multiplexed data signals being multiplexed in the above two selector circuits 103 are multiplexed. Then, it may be configured so that 1/16 frequency-divided clock signals (1/16 CLK) with eight phases being generated in the clock generator circuit according to the aforementioned second embodiment are respectively supplied to the first selector circuits 101; 1/8 frequency-divided clock signals (1/8 CLK) with four phases are respectively supplied to the second selector circuits 102; 1/4 frequency-divided clock signals (1/4 CLK) with two phases are respectively supplied to the third selector circuits 103; and a 1/2 frequency-divided clock signal (1/2 CLK) with a single phase is supplied to the fourth selector circuit 104. Additionally, such is also the case in the event of configuring a 4:1 multiplexer circuit, or other multiplexer circuits.

Further, in addition to the signal multiplexing circuit of such the configuration, the arrangement may also be made in such a manner as to configure an optical transmitter in an optical communication system, as having an amplifier circuit (amplifier) for amplifying the output of the signal multiplexing circuit, and a modulation circuit (modulator) for modulating the optical signal using the output of the amplifier circuit. Here, as to the configuration, etc. of the optical transmitter in the optical communication system, it is the same as that having been described, for example, in the Japanese Patent Laid-Open (Kokai) 2004-147075.

It is noted that the present invention is not limited to the configurations described concerning the aforementioned respective embodiments and other descriptive portions, and modifications may be possible without departing from the scope of the invention.

What is claimed is:

1. A clock generator circuit comprising:
   a pre-stage and a post-stage toggle flip-flop circuit capable of outputting a pair of frequency-divided clock signals with different phases; and
   a delay flip-flop circuit capable of outputting a clock signal with a phase shifted with respect to the phases of the pair of frequency-divided clock signals being outputted from said post-stage toggle flip-flop circuit by delaying either one of the pair of frequency-divided clock signals being outputted from said post-stage toggle flip-flop circuit; wherein
   said post-stage toggle flip-flop circuit receives, as clock input, one of a pair of frequency-divided clock signals being outputted from the pre-stage toggle flip-flop circuit,
   said delay flip-flop circuit receives, as clock input, the other of the pair of frequency-divided clock signals being outputted from said pre-stage toggle flip-flop circuit, while the delay flip-flop circuit receives, as data input, either one of the pair of frequency-divided clock signals being outputted from said post-stage toggle flip-flop circuit;
   each of said pre-stage and post-stage toggle flip-flop circuits comprises a first latch circuit and a second latch circuit;
   the output signal of the first latch circuit is inputted to the second latch circuit and is outputted as the one of the pair of frequency-divided clock signals, while the output signal of the second latch circuit is inputted to the first latch circuit and is outputted as the other of the pair of frequency-divided clock; and
   the output signal outputted from the first latch circuit of the pre-stage toggle flip-flop circuit is inputted, as clock input, to the first latch circuit of the post-stage toggle flip-flop circuit and an inverted signal of the output signal outputted from the first latch circuit of the pre-stage toggle flip-flop circuit is inputted, as clock input, to the second latch circuit of the post-stage flip-flop circuit.

2. The clock generator circuit according to claim 1, wherein the delay flip-flop circuit comprises a third latch circuit and a fourth latch circuit, and
   the output signal of the third latch circuit is inputted to the fourth latch circuit, while the output signal of the first latch circuit is inputted to the third latch circuit, a third frequency-divided clock signal and a fourth frequency-divided clock signal are outputted from the third latch circuit and the fourth latch circuit based on a second input clock signal having a phase shifted with respect to the phase of the first input clock signal, respectively.

3. The clock generator circuit according to claim 1, wherein the pair of frequency-divided clock signals has a phase difference of $\pi/2$ relative to each other.

4. A clock generator circuit comprising:
   a plurality of toggle flip-flop circuits connected in series, each of said plurality of toggle flip-flop circuits including a first latch circuit and a second latch circuit, and capable of outputting a pair of frequency-divided clock signals with different phases, said plurality of toggle flip-flop circuits including a first stage toggle flip-flop circuit; and one or more delay flip-flop circuits capable of outputting a clock signal with a phase shifted with respect to the phases of the pair of frequency-divided clock signals being outputted from each of one or more of the plurality of toggle flip-flop circuits other than the first stage toggle flip-flop circuit by delaying either one of the pair of frequency-divided clock signals being outputted from said each of one or more of the plurality of toggle flip-flop circuits without frequency dividing;

wherein a number of said one or more delay flip-flop circuits is set such that a desired number of frequency-divided clock signals with different phases having the same frequency is generated;

the output signal of the first latch circuit is inputted to the second latch circuit and is outputted as the one of the pair of frequency-divided clock signals, while the output signal of the second latch circuit is inputted to the first latch circuit and is outputted as the other of the pair of frequency-divided clock signals; and the output signal outputted from the first latch circuit of the pre-stage toggle flip-flop circuit is inputted, as clock input, to the first latch circuit of the post-stage toggle flip-flop circuit and an inverted signal of the output signal outputted from the first latch circuit of the pre-stage toggle flip-flop circuit is inputted, as clock input, to the second latch circuit of the post-stage toggle flip-flop circuit.

5. A signal multiplexing circuit comprising:

said clock generator circuit according to claim 1; and a plurality of selector circuits for multiplexing two data signals, based on each of the plurality of frequency-divided clock signals generated by the clock generator circuit.

6. The signal multiplexing circuit according to claim 5, wherein said signal multiplexing circuit is configured to multiplex data signals of more than 4 channels.

7. An optical transmitter comprising:

said signal multiplexing circuit according to claim 5;

an amplifier circuit which amplifies an output of said signal multiplexing circuit; and a modulation circuit which modulates an optical signal in response to an output of said amplifier circuit.

8. A clock generation method comprising:

generating, as a first clock signal, a pair of frequency-divided clock signals with different phases by means of a first toggle flip-flop circuit; and generating, as a second clock signal, a pair of frequency-divided clock signals with different phases by frequency dividing either one of the pair of frequency-divided clock signals generated by the first toggle flip-flop circuit by means of a second toggle flip-flop circuit; and generating, as the second clock signal, a delayed pair of frequency-divided clock signals with different phases by delaying either one of the pair of frequency-divided clock signals generated by the second toggle flip-flop circuit using, as clock input, the other of the pair of frequency-divided clock signals generated by the first toggle flip-flop circuit, by means of a delay flip-flop circuit;

wherein each of the first toggle flip-flop circuit and the second toggle flip-flop circuit comprises a first latch circuit and a second latch circuit;

the output signal of the first latch circuit is inputted to the second latch circuit and is outputted as the one of the pair of frequency-divided clock signals, while the output signal of the second latch circuit is inputted to the first latch circuit and is outputted as the other of the pair of frequency-divided clock signals; and the output signal outputted from the first latch circuit of the pre-stage toggle flip-flop circuit is inputted, as clock input, to the first latch circuit of the post-stage toggle flip-flop circuit and an inverted signal of the output signal outputted from the first latch circuit of the pre-stage toggle flip-fop circuit is inputted, as clock input, to the second latch circuit of the post-stage toggle flip-flop circuit.

9. The clock generation method according to claim 8, comprising the steps of:

generating, as a third clock signal, a third pair of frequency-divided clock signals with different phases by means of a third toggle flip-flop circuit, based on either one of the second pair of frequency-divided clock signals generated by the second toggle flip-flop circuit, and generating delayed plural pairs of frequency-divided clock signals with different phases by delaying either one of the third pair of frequency-divided clock signals generated by the third toggle flip-flop circuit using, as clock input, either one of the frequency-divided clock signals generated as the second clock signal, by means of a plurality of delay flip-flop circuits.

* * * * *